United States Patent
Mosser et al.

[19]

[11] Patent Number: 5,942,796
[45] Date of Patent: Aug. 24, 1999

[54] PACKAGE STRUCTURE FOR HIGH-POWER SURFACE-MOUNTED ELECTRONIC DEVICES

[75] Inventors: Ben Mosser, San Diego; Kenneth Jones, Escondido, both of Calif.

[73] Assignee: Advanced Packaging Concepts, Inc., Vista, Calif.

[21] Appl. No.: 08/971,322

[22] Filed: Nov. 17, 1997

[51] Int. Cl.[6] .................................................. H01L 23/34
[52] U.S. Cl. ...................... 257/712; 257/720; 257/703; 257/704; 257/708
[58] Field of Search ........................... 257/712, 703–706, 257/678, 684, 711, 713, 720; 361/600, 679, 688

[56] References Cited

U.S. PATENT DOCUMENTS

| | | | |
|---|---|---|---|
| 4,172,261 | 10/1979 | Tsuzuki et al. ............................ | 257/706 |
| 5,111,277 | 5/1992 | Medeiros, III et al. .................. | 257/720 |
| 5,477,081 | 12/1995 | Nagayoshi ................................ | 257/678 |
| 5,481,136 | 1/1996 | Kohmoto et al. ........................ | 257/712 |
| 5,644,163 | 7/1997 | Tsuji ......................................... | 257/706 |

FOREIGN PATENT DOCUMENTS

| | | | |
|---|---|---|---|
| 2-276264 | 11/1990 | Japan ....................................... | 257/705 |
| 3-62956 | 3/1991 | Japan ....................................... | 257/717 |
| 0 427 265 | 5/1991 | Japan ....................................... | 257/717 |

*Primary Examiner*—Mahshid Saadat
*Assistant Examiner*—Jhihan B Clark
*Attorney, Agent, or Firm*—Gregory Garmong

[57] ABSTRACT

An electronic device structure includes a ceramic base and a ceramic lid. The base has a ceramic body with sides and a bottom defining an interior cavity of the ceramic body. There is a first body aperture through the bottom of the ceramic body, a first metallic base pad affixed to an exterior of the bottom of the ceramic body and overlying the first body aperture, a second aperture through the bottom of the ceramic body, and a second metallic base pad affixed to an exterior of the bottom of the ceramic and overlying the second aperture. The second base pad has a second base pad aperture therethrough aligned with the second aperture. A bonding button is positioned within the interior cavity and overlying the second aperture. The bonding button is formed of a bonding pad in the interior of the ceramic and an integral connector extending through the second aperture and the second base pad aperture and affixed to the second base pad. A high-power electronic device such as a power MOSFET is affixed to an interior surface of the first metallic base pad, and a wire interconnector extends from the electronic device to the bonding pad of the bonding button.

22 Claims, 3 Drawing Sheets

PACKAGE STRUCTURE FOR HIGH-POWER SURFACE-MOUNTED ELECTRONIC DEVICES

BACKGROUND OF THE INVENTION

This invention relates to packaged electronic devices and, more particularly, to a package structure for a surface-mounted electronic device.

Many electrical devices are fragile and readily damaged by dust, corrosive agents, and the like. To protect the electrical devices, they are usually packaged in a protective housing. The nature of the housing is selected according to the type of electrical device being packaged and the expected service conditions.

In one approach used where the electronic device and package may be exposed to elevated temperatures in service, because of the environment or because the electronic device produces a great deal of heat, the electronic device is packaged in a ceramic housing which provides mechanical protection and, additionally, may be hermetically sealed to protect against intrusion of liquids or gases that may damage the packaged device. The package normally includes two parts, a base to which the electronic device is affixed, and a lid. To fabricate the final packaged structure, the electronic device is affixed to the base and electrical connections are made to the electronic device. The electrical connections are typically made by surface traces extending from the interior of the package to the exterior, or by vias extending through the bottom side of the base. After the electrical device is affixed to the base and electrically connected, the lid is positioned over the electronic device and affixed to the base, as by brazing or soldering.

When the electronic device itself produces a great deal of heat in operation, as in the case of power MOSFETs, the package is structured to provide a heat sink function that conducts the produced heat from the interior to the exterior of the package. An external heat sink may be affixed to the bottom of the package to aid in the removal of heat.

Although existing packages and proposed package designs are operable to some extent, there is always a need for packages that have improved convenience of use with reduced fabrication costs. Such improved packages should have good electrical performance as well as thermal performance, particularly when used to package high-power electronic devices. The present invention fulfills this need, and further provides related advantages.

SUMMARY OF THE INVENTION

The present invention provides a package structure, a packaged electronic device, and a method for making the package structure and packaged electronic device. The package is designed to remove large amounts of heat from the enclosed electronic device. The package structure is therefore most beneficially used for electronic devices that produce a large amount of heat in service, such as surface-mounted power MOSFETs and the like. The package includes substantial solid feedthroughs with high current-carrying capability and high heat-carrying capability. The feedthroughs are self-aligning to facilitate assembly during fabrication. The required length of the wire bond between the feedthroughs and the electronic device are small. The fabrication process permits variations that allow the use of plain or pre-metallized feedthroughs, yet has reduced cost. The package design minimizes thermal stresses produced during fabrication and service, reducing the likelihood of failure of the package.

In accordance with the invention, an electronic device structure comprises a base including a body having sides and a bottom defining an interior cavity of the body, a first aperture through the bottom of the body, and a first metallic base pad affixed to an exterior of the bottom of the body and overlying the first aperture. There is additionally a second aperture through the bottom of the body, and a second metallic base pad affixed to an exterior of the bottom of the body and overlying the second aperture. The second base pad has a second base pad aperture therethrough aligned with the second aperture. A bonding button overlies the second aperture. The bonding button comprises a bonding pad in the interior of the body, and an integral connector extending through the second aperture and at least a portion of the second base pad aperture. The bonding button is affixed to the bottom of the body, most preferably indirectly by affixing the integral connector to the second base pad, with or without any direct affixing to the body. In a preferred embodiment, there are two or more of the bonding buttons, extending through separate second apertures and second base pad apertures, for providing multiple power feedthroughs to the interior of the package.

In its final assembled form, the structure further includes an electronic device affixed to an interior surface of the first metallic base pad, and a wire interconnector extending from the electronic device to the bonding pad of the bonding button. The approach of the invention is most beneficially used where the electronic device generates substantial amounts of heat during service, such as a power MOSFET. A lid is affixed to the sides of the body to complete the assembly.

The approach of the invention is compatible with the use of a wide variety of materials tailored to specific applications. For example, the body may be made from a ceramic, such as aluminum oxide, aluminum nitride, beryllium oxide, or silicon carbide, or a plastic such as an epoxy, and the lid may be made from a ceramic, a metal, or a plastic. The first metallic base pad and the second metallic base pad may each be made of a highly thermally conductive material such as copper/tungsten composite material, copper/molybdenum composite material, copper/molybdenum/copper laminate material, molybdenum, tungsten, or metallized beryllium oxide. The bonding button may be made of a highly electrically and thermally conductive material such as copper or copper/tungsten composite material. The bonding pad of the bonding button may be coated either before or after assembly with a coating to improve wire bonding to the bonding pad, such as aluminum.

The present invention also includes the method of fabricating the packaged electronic device. The base, base pads, and bonding button as described above are furnished as separate elements. The first and second metallic base pads are affixed to the exterior of the bottom of the body, with the first base pad overlying the first aperture and the second metallic base pad overlying the second aperture with the second base pad aperture aligned with the second aperture. The bonding button is affixed to the body overlying the second aperture, with the integral connector extending through the second aperture and through at least a portion of the second base pad aperture, and affixed to the second base pad. All of the affixing operations may be accomplished simultaneously in a single braze operation, or the base pads may be first affixed to the body and, later, the bonding button may be affixed to the second base pad. The latter has advantages in circumstances where the bonding pad is to be pre-metallized with aluminum.

The present approach has important advantages over prior approaches and alternative approaches. The present approach has high electrical current capacity and large thermal removal capability. It is also fabricated readily easily, as compared with alternative approaches. Joining of the components is accomplished by straightforward bonding techniques. The approach of the invention minimizes thermal stresses within the package, which would otherwise be present due to the different materials used in the various components and the temperature excursions experienced of the package structure experienced during fabrication and during many service applications.

The present approach provides an improved package structure and packaged electronic device, as well as a fabrication approach that is particularly advantageous. Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
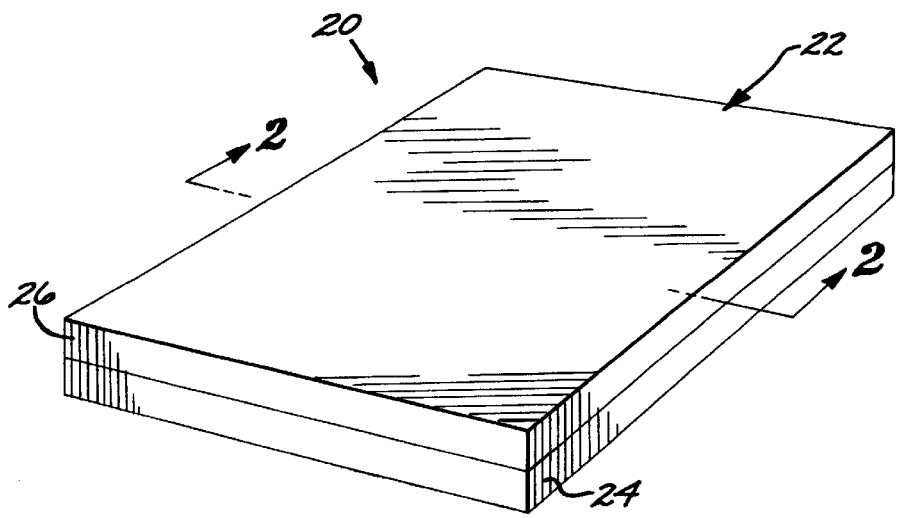
FIG. 1 is a perspective view of a packaged electronic device.

FIG. 1 illustrates a packaged electronic device 20, including a package 22. The electronic device itself is in the interior of the package 22, and is not visible in FIG. 1. The package includes a base 24 and a lid 26 affixed to the base 24.

Figure 2:
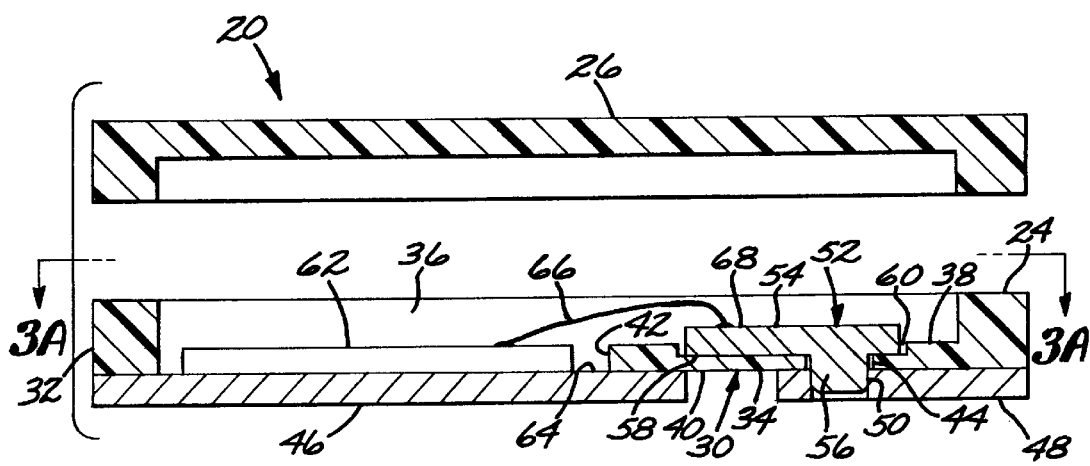
FIG. 2 is a partially exploded sectional view of the packaged electronic device of FIG. 1, taken along lines 2—2.

FIG. 2 illustrates the packaged electronic device 20 in a partially exploded view that shows the components. The base 24 includes a body 30 having sides 32 and a bottom 34 defining an interior cavity 36 of the body 30. The body has an interior surface 38 and an exterior surface 40. There are two apertures through the bottom 34 of the body 30, a first aperture 42 and a second aperture 44. In the preferred approach, the first aperture 42 is larger in lateral extent than the second aperture 44.

A first metallic base pad 46 is affixed to the exterior surface 40 of the bottom 34 of the body 30, overlying the outside of the first aperture 42. A second metallic base pad 48 is affixed to the exterior surface 40 of the bottom 34 of the body 30, overlying the outside of the second aperture 44. That is, the two base pads 46 and 48 affixed to the exterior surface 40 of the body 30, but at different locations.

The second base pad 48 has a second base pad aperture 50 therethrough. The second aperture 44 and the second base pad aperture 50 are preferably circular in cross section. The centerline of the second base pad aperture 50 is aligned with the centerline of the second aperture 44, although their lateral sizes may be, and usually are, slightly different, with the diameter of the second aperture 44 being larger than the diameter of the second base pad aperture 50.

A bonding button 52 overlies the second aperture 44. The bonding button 52 has a bonding pad 54 disposed within the interior cavity 36 of the body 30 and an integral connector 56 in the shape of a pin extending through the second aperture 44 and at least a portion of the way through the second base pad aperture 50. The bonding pad 54 and the connector 56 are preferably formed of a single piece of material. For the preferred case where the second aperture 44 and the second base pad aperture 50 are cylindrical, the connector 56 is also cylindrical. The connector 56 and the apertures 44 and 50 are preferably sized such that aperture 44 has a cylindrical diameter at least about 0.002 inches greater than the cylindrical diameter of the connector 56, to avoid thermal stresses as the packaged electronic device 20 is repeatedly heated and cooled during fabrication and during service. The aperture 50, on the other hand, is sized to be a relatively tight fit with the connector 56.

The bonding button 52 is affixed to the bottom 34 of the body 30, preferably indirectly by affixing the connector 54 to the second base pad 48. That is, the connector 54 is preferably affixed to the second base pad 58 along the sides of the second base pad aperture 50, as for example by brazing or soldering. This provides an indirect structural connection of the bonding button 52 to the body 30, through the second base pad 48. The bonding button 52 may be affixed directly to the bottom 34 of the body 30, instead of or in addition to the indirect connection through the second base pad 48. However, the direct affixing of the bonding button 52 to the body 30 is not preferred, due to the difference in coefficients of thermal expansion between these components in many materials combinations. The indirect affixing approach produces a joint between the metallic connecter 54 and the metallic or composite second base pad 58, rather than between the metallic connector 54 and the body 30, which in many applications is a ceramic with a much smaller coefficient of thermal expansion than the connector 54.

The interior surface 38 of the body 30 is preferably shaped with a recess 58 therein. The recess 58 is sufficiently large to receive the bonding pad 54 therein. The recess 58 has a lateral size that is sufficiently larger than that of the bonding pad 54 to leave a gap 60 of at least about 0.002 inches between the bonding pad 54 and the wall of the recess 58, on all sides. The recess 58 laterally positions the bonding pad 54 in a precise location and aids in guiding the bonding pad 54 and thence the connector 56 into position during assembly. The design of the recess 58 as slightly oversize prevents the development of thermal stresses as the packaged electronic device 20 is repeatedly heated and cooled during fabrication processing and in service.

An electronic device 62 is affixed to an interior surface 64 of the first metallic base pad 46. A wire interconnector 66 extends from the appropriate locations of the electronic device 62 to the bonding pad 54 of the bonding button 52. The electronic device 62 may be of any operable type, but in the preferred application of the inventors the electronic device 62 is a power MOSFET (metal oxide semiconductor field effect transistor). The first metallic base pad 46 serves as both a heat sink for the power MOSFET and an electrical interconnect to the power MOSFET. The conductive path from the electronic device 62, through the wire interconnect 66, through the bonding button 52, and through the second metallic base pad 48 serves as a second electrical interconnect to the power MOSFET, and secondarily as a heat flow path. As will be discussed in relation to FIGS. 3–4, there is typically at least one additional bonding button structure provided in the package 22, providing a third electrical interconnect to the power MOSFET, as required for this type of device.

In the final assembled packaged electronic device 20, the lid 26 is affixed to the base 24, at the sides 32 of the body 30. The lid 26 is preferably hermetically sealed with a brazed or soldered joint, isolating the electronic device 62 inside the package 22 from physical effects in the external environment. For applications not requiring a hermetic seal, the lid 26 may be affixed to the base 24 with an adhesive such as an epoxy.

The body 30 is preferably a single unitary piece, made of any operable material. For high-temperature applications, it is preferred that the body 30 be made of a ceramic such as, for example, aluminum oxide, aluminum nitride, beryllium oxide, or silicon carbide. These materials may be formed to shape by any operable approach, but usually they are provided as powders in a binder and sintered. For lower-temperature applications, the body 30 may be a plastic such as an epoxy. The plastic may be formed to shape by any operable approach, but is preferably cast to shape.

The lid 26 is preferably a single unitary piece, made of any operable material. For high-temperature applications, it is preferred that the lid 26 be made of the same ceramic material as the body 30. For lower temperature applications, the lid 26 may be made of a metal such as an iron-nickel-cobalt alloy of the kovar type. For even lower temperature applications, the lid 26 may be made of a plastic such as an epoxy.

The first metallic base pad 46 and the second metallic base pad 48 are each made of any operable electrically conductive and thermally conductive material. Preferred such materials include copper/tungsten composite material, copper/molybdenum composite material, copper/molybdenum/copper laminate material, molybdenum, tungsten, or metallized beryllium oxide. The materials used in the first metallic base pad 46 and the second metallic base pad 48 are selected so as to have as close a match as reasonably possible with the material used for the body 30, to minimize thermal stresses as the packaged electronic device 20 is repeatedly heated and cooled in service.

The bonding button 52 is made of any operable electrically conductive and thermally conductive material. Preferred such materials include copper and copper/tungsten composite material. At least a portion of the bonding button 52, specifically the exposed surface of the bonding pad 54, may optionally have a metallized coating 68 thereon. The metallized coating 68, where present, aids in achieving a good wire bond with the wire interconnector 66. The metallized coating is preferably aluminum. The metallized coating 68 may include a protective coating such as a nickel/gold coating.

Figure 3A:
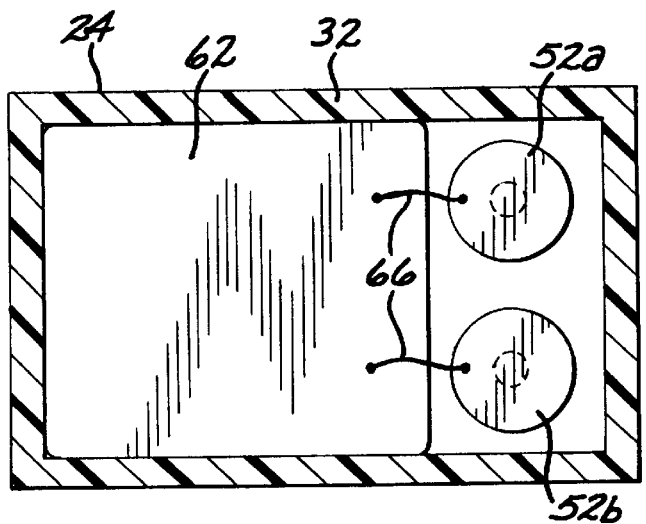
FIG. 3A is a plan view of a first embodiment of the packaged electronic device of FIG. 2, taken along lines 3A—3A.
Figure 4A:
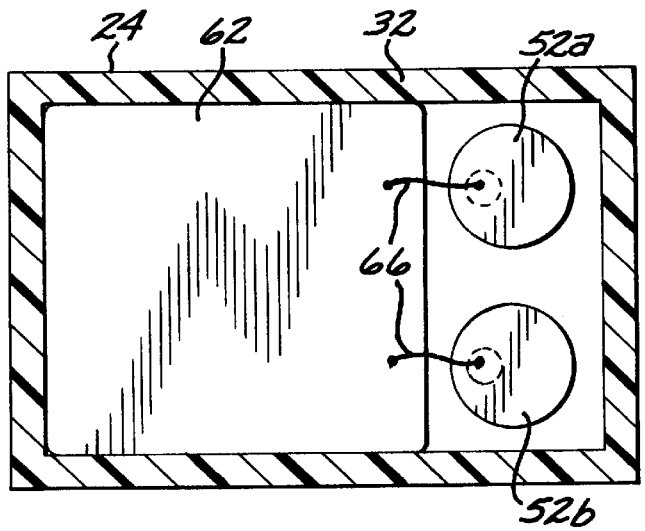
FIG. 4A is a plan view of a first embodiment of the packaged electronic device of FIG. 2, taken along lines 3A—3A.

FIGS. 3A and 4A depict two embodiments of the package 22 wherein there are two bonding buttons 52a and 52b in each case. Each of the bonding buttons 52a and 52b has its own separate second metallic base pad 48, which cannot be seen in FIGS. 3A and 4A. The two second metallic base pads are of comparable structure and comparable to that discussed earlier, but are electrically isolated from each other. These two bonding buttons 52a and 52b, together with the connection through the first metallic base pad 46, provide a total of three external electrical interconnects to the electronic device 62. These principles may be extended to provide more than two bonding buttons for the package, with even more external electrical interconnects.

Figure 3B:
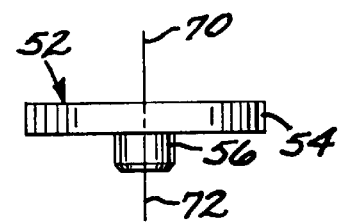
FIG. 3B is an elevational view of the bonding button used in the embodiment of FIG. 3A.
Figure 4B:
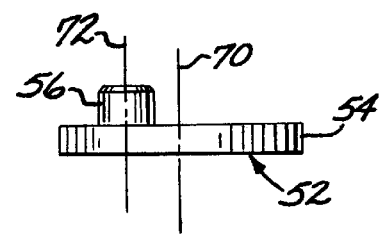
FIG. 4B is an elevational view of the bonding button used in the embodiment of FIG. 4A.

In some applications, it is desirable that the length of the wire interconnect 66 be as short as possible, within the constraints of fabricability, to minimize the possibility that the wire interconnect will deform and fail due to inertial loads experienced during service. To reduce the length of the distance between bonding pad 54 and the electronic device 62, the centerline of the connector 56 may be laterally offset from the centerline of the bonding button 52, as seen by comparing FIGS. 3B and 4B. In FIG. 3B, the centerline 72 of the connector 56 is coincident with the centerline 70 of the bonding pad 54. In FIG. 4B, the centerline 72 of the connector 56 is laterally offset from the centerline 70 of the bonding pad 54. This permits the bonding pad 54 to be positioned as shown in FIG. 4A, so that it is closer to the electronic device 62 than the bonding pad 54 shown in FIG. 3A.

Figure 5:
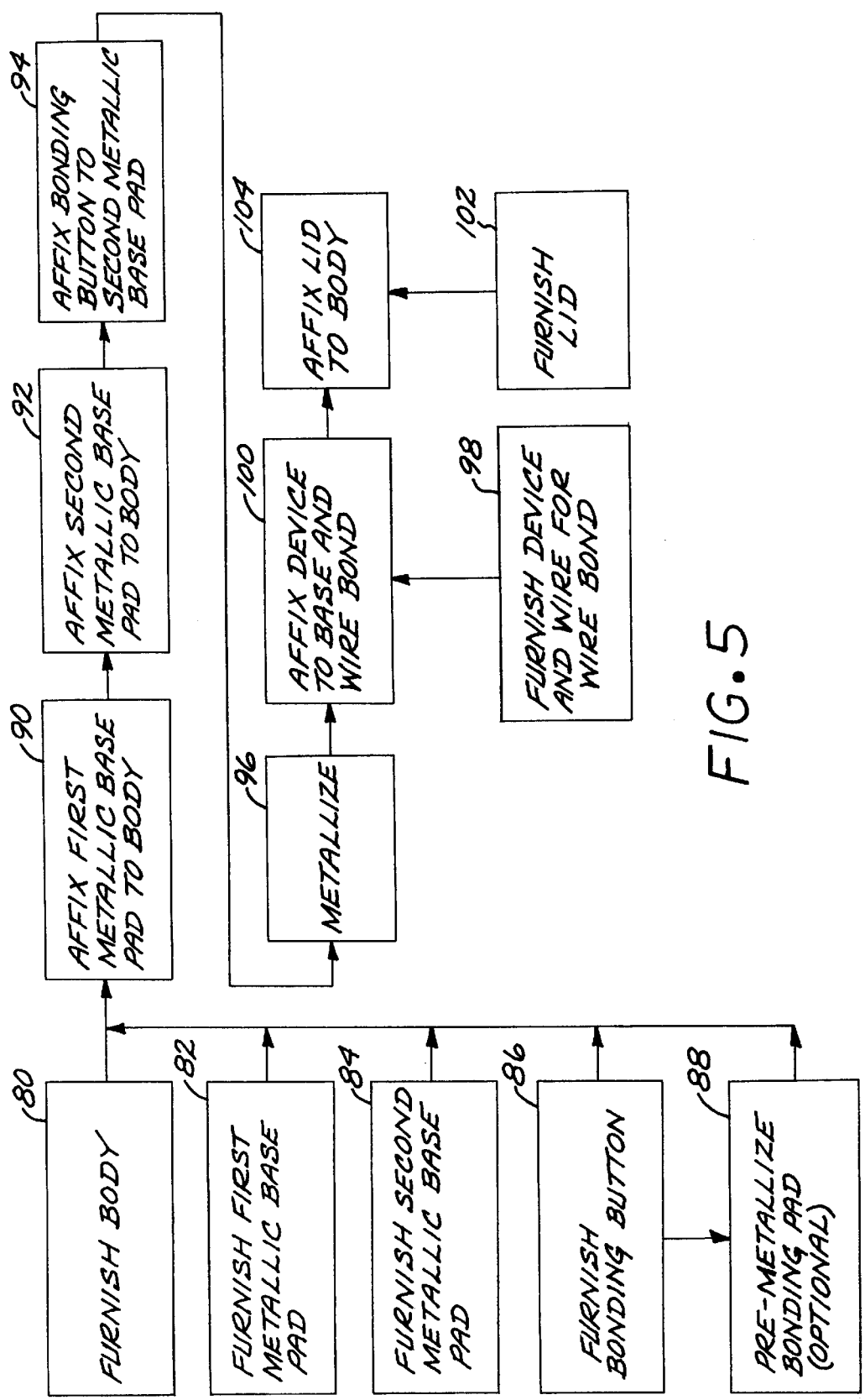
FIG. 5 is a block flow diagram of a method for practicing the approach of the invention.

FIG. 5 illustrates preferred approaches for practicing the invention. The structures of the individual components are as described above. The body 30 is furnished, numeral 80; the first metallic base pad 46 is furnished, numeral 82; the second metallic base pad 48 is furnished, numeral 84, and the bonding button 52 is furnished, numeral 86. These are all furnished as individual, freestanding components. The bonding pad 54 of the bonding button 52 may optionally be pre-metallized prior to subsequent assembly, numeral 88, such as by vapor deposition of an aluminum layer onto the bonding pad 54.

The first metallic base pad 46 is assembled to and affixed to the body 30, numeral 90; the second metallic base pad 48 is assembled to and affixed to the body 30, numeral 92; and the bonding button 52 is assembled to and affixed to the body 30, numeral 94. The steps 90, 92, and 94 may be performed separately in a sequence, but more preferably at least some of the steps are performed simultaneously. The steps 90 and 92 are almost always performed simultaneously. The step 94 may be performed simultaneously with the steps 90 and 92, or it may be performed subsequently, after the steps 90 and 92 are complete. In a typical case, if the bonding pad 54 is not pre-metallized, the steps 90, 92, and 94 are performed simultaneously by providing a brazing material between the facing surfaces and heating the assembled structure to a brazing temperature. If, on the other hand, the bonding pad 54 is pre-metallized with a pre-metallization material such as aluminum that will diffuse into the bonding pad 54 at the temperatures required for brazing, the steps 90 and 92 are first performed by brazing without the bonding button 52 in place. The pre-metallized bonding button 52 is thereafter assembled to the brazed structure and soldered into place with a lower-temperature solder in step 94. The braze and solder materials are specific to the materials used in the package, and known in the art for each material combination.

The exposed metallic surfaces of the package are metallized with a protective coating that also aids in attachment of leads, numeral 96. A preferred such coating is a gold-over-nickel coating having a nickel layer deposited on the surface and a gold layer overlying the nickel coating.

The electronic device 62 and the wire interconnector 66 are furnished, numeral 98. The electronic device 62 is affixed to the interior surface 64 of the first metallic base pad 46, preferably by soldering. The wire interconnector 66 is connected between the appropriate pad location of the electronic device 62 and the bonding pad 54, preferably by wire bonding. As discussed in relation to FIGS. 3A and 4A, there are two such connections to bonding pads 54 to be made in the case of the preferred application of the inventors, the packaged power MOSFET.

The lid 26 is furnished, numeral 102. The lid 26 is affixed to the base 24 by any operable technique, numeral 104. The preferred approach is to solder the lid 26 to the nickel/gold coating using a gold-tin solder. For lower-temperature applications, the lid 26 may be affixed to the base 24 using an adhesive such as an epoxy.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. An electronic device structure comprising:
    a base including
        a body having sides and a bottom defining an interior cavity of the body,
        a first aperture through the bottom of the body,
        a first base pad affixed to an exterior of the bottom of the body and overlying the first aperture,
        a second aperture through the bottom of the body,
        a second base pad affixed to an exterior of the bottom of the body and overlying the second aperture, the second base pad having a second base pad aperture therethrough aligned with the second aperture, and
        a bonding button affixed to the body and overlying the second aperture, the bonding button comprising a bonding pad in the interior cavity of the body and an integral connector extending through the second aperture and at least a portion of the second base pad aperture.

2. The structure of claim 1, wherein the bonding button is affixed to the second base pad.

3. The structure of claim 1, wherein the first base pad and the second base pad are made of metals.

4. The structure of claim 1, further including
    an electronic device affixed to an interior surface of the first metallic base pad, and
    a wire interconnector extending from the electronic device to the bonding pad of the bonding button.

5. The structure of claim 1, further including:
    a lid affixed to the sides of the body.

6. The structure of claim 1, wherein the body is made from a material selected from the group consisting of a ceramic and a plastic.

7. The structure of claim 1, wherein the body is made of a material selected from the group consisting of aluminum oxide, aluminum nitride, beryllium oxide, silicon carbide, and a plastic.

8. The structure of claim 1, wherein the first base pad and the second base pad are each made of a material selected from the group consisting of copper/tungsten composite material, copper/molybdenum composite material, copper/molybdenum/copper laminate material, molybdenum, tungsten, and metallized beryllium oxide.

9. The structure of claim 1, wherein the bonding button is made of a material selected from the group consisting of copper and copper/tungsten composite material.

10. The structure of claim 1, wherein at least a portion of the bonding button has a metallized coating thereon.

11. The structure of claim 1, wherein an axis of the integral connector is coincident with an axis of the bonding pad.

12. The structure of claim 1, wherein an axis of the integral connector is laterally offset from an axis of the bonding pad.

13. The structure of claim 1, wherein the second aperture has a diameter greater than that of the integral connector by at least about 0.002 inches.

14. The structure of claim 1, wherein the bottom of the body includes a recess on an inwardly facing surface thereof, the recess being sized to receive the bonding pad therein with a lateral gap between the bonding pad and a wall of the recess.

15. The structure of claim 4, wherein the electronic device is a power MOSFET.

16. The structure of claim 5, wherein the lid is made from a material selected from the group consisting of a ceramic, a metal, and a plastic.

17. An electronic device structure comprising:
    a base including
        a ceramic body having sides and a bottom defining an interior cavity of the ceramic body,
        a first aperture through the bottom of the ceramic body,
        a first metallic base pad affixed to an exterior of the bottom of the ceramic body and overlying the first aperture,
        at least two second apertures through the bottom of the ceramic body,
        at least two second metallic base pads affixed to an exterior of the bottom of the ceramic body, one of the second metallic base pads overlying each of the respective at least two second apertures, each second metallic base pad having a second base pad aperture therethrough aligned with the respective second aperture, and
        at least two bonding buttons, one bonding button overlying each of the respective at least two second apertures, each bonding button comprising a bonding pad in the interior cavity of the ceramic body and an integral connector extending through the respective second aperture and at least a portion of the respective second base pad aperture and affixed to the respective second metallic base pad.

18. The structure of claim 17, further including:
    a ceramic lid affixed to the sides of the ceramic body.

19. The structure of claim 17, further including
    an electronic device affixed to an interior surface of the first metallic base pad, and
    a wire interconnector extending from the electronic device to the bonding pad of the bonding button.

20. A method of fabricating a packaged electronic device, comprising the steps of
    furnishing a base including
        a body having sides and a bottom defining an interior cavity of the body,
        a first aperture through the bottom of the body, and
        a second aperture through the bottom of the body,
    furnishing
        a first metallic base pad, and
        a second metallic base pad, the second base pad having a second base pad aperture therethrough, and
        a bonding button comprising a bonding pad and an integral connector extending therefrom;
    affixing the first metallic base pad to an exterior of the bottom of the body and overlying the first aperture;
    affixing the second metallic base pad to an exterior of the bottom of the body and overlying the second aperture, with the second base pad aperture aligned with the second aperture; and affixing the bonding button to the body such that the bonding button is within the interior cavity and overlying the second aperture, and such that the integral connector extends through at least a portion of the second aperture and the second base pad aperture.

21. The method of claim 20, wherein the steps of affixing the first metallic base pad, affixing the second metallic base pad, and affixing the bonding button are performed concurrently.

22. The method of claim 20, wherein the steps of affixing the first metallic base pad and affixing the second metallic base pad are performed concurrently, and the step of affixing the bonding button is performed after the steps of affixing the first metallic base pad and affixing the second metallic base pad are completed.

* * * * *